(12) United States Patent
He

(10) Patent No.: US 11,490,507 B2
(45) Date of Patent: Nov. 1, 2022

(54) CIRCUIT BOARD AND MANUFACTURING METHOD OF CIRCUIT BOARD

(71) Applicant: HKC CORPORATION LIMITED, Shenzhen (CN)

(72) Inventor: HuaiLiang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 171 days.

(21) Appl. No.: 17/035,802

(22) Filed: Sep. 29, 2020

(65) Prior Publication Data

US 2021/0014961 A1   Jan. 14, 2021

Related U.S. Application Data

(63) Continuation-in-part of application No. PCT/CN2018/120490, filed on Dec. 12, 2018.

(30) Foreign Application Priority Data

Nov. 21, 2018  (CN) .......................... 201811389127.1

(51) Int. Cl.
  *H05K 1/02* (2006.01)
  *H01R 12/70* (2011.01)
  *H05K 1/11* (2006.01)

(52) U.S. Cl.
  CPC ....... *H05K 1/0242* (2013.01); *H01R 12/7076* (2013.01); *H05K 1/111* (2013.01); *H05K 1/117* (2013.01)

(58) Field of Classification Search
  CPC ............ H01R 12/7076; H01R 12/7082; H01R 12/707; H01R 12/732; H01R 12/7041; H05K 1/0242
  See application file for complete search history.

(56) References Cited

U.S. PATENT DOCUMENTS 6,916,185 B2 *  7/2005  Hedler .................... H01L 24/14
                                                         257/E21.511
2017/0330827 A1   11/2017  Rohrmoser et al.

FOREIGN PATENT DOCUMENTS

| CN | 101083873 A | 12/2007 |
| CN | 201181750 Y | 1/2009 |
| CN | 101674706 A | 3/2010 |
| CN | 106714450 A | 5/2017 |
| JP | 2006041141 A | 2/2006 |

OTHER PUBLICATIONS

Xiaoying Hu, the ISA written comments, dated Aug. 2019, CN.
Xiaoying Hu, the International Search Report, dated Aug. 2019, CN.

* cited by examiner

*Primary Examiner* — Jeremy C Norris

(57) ABSTRACT

This application discloses a circuit board and a manufacturing method of the circuit board. The circuit board includes a signal transmission pin pad configured to connect with signal transmission pins of an external same kind connectors to transmit a signal, and fixing pads configured to fix fixing pins of the connectors. A number, location, and size of the fixing pads are matched with a same kind connector. The same kind connector is a connector with a same number of signal transmission pins and a same distance of pins. The number of the fixing pads is greater than or equal to a maximum number of fixing pins of the same kind connector.

16 Claims, 6 Drawing Sheets

CIRCUIT BOARD AND MANUFACTURING METHOD OF CIRCUIT BOARD

CROSS REFERENCE OF RELATED APPLICATIONS

The present application is a continuation-in-part of application No. PCT/CN2018/120490 filed on Dec. 12, 2018, which claims the benefit of Chinese Patent Application No. CN201811389127.1 filed on Nov. 21, 2018, and entitled "CIRCUIT BORAD AND MANUFACTURING METHOD OF CIRCUIT BORAD". The entire contents of the above applications are hereby incorporated by reference in their entirety.

TECHNICAL FIELD

This application relates to the field of display technologies, and in particular, to a circuit board and a manufacturing method of the circuit board.

BACKGROUND

The description herein provides only background information related to this application, but does not necessarily constitute the existing technology.

With development and advancement of technology, flat panel displays have become mainstream product of displays and widely used due to their thin bodies, power savings, and low radiation, etc. The flat panel displays include a Thin Film Transistor-Liquid Crystal Display (TFT-LCD). Wherein the TFT-LCD refracts a light of a backlight module to generate image through controlling rotation direction of liquid crystal molecules. The TFT-LCD has many advantages such as thin body, power saving, and no radiation, etc.

Flat panel displays have become more diverse. Each connector correspondingly has a connector interface circuit board. Since research and development capabilities and process capabilities of each connector manufacturer are different, a shape and structure of the connector from each factory has difference. In order to meet requirements of customers, different circuit boards match to different connectors, which increases product cost and causes low matching of the products.

SUMMARY

This application provides a circuit board and a manufacturing method of the circuit board, to improve matching of the circuit board and reduce high production costs.

To achieve to foregoing objective, this application provides the circuit board, comprising a signal transmission pin pad configured to connect with signal transmission pins of an external same kind connector to transmit a signal, and a fixing pad configured to fix fixing pins of a connector. A number, location, and size of the fixing pads are matched with multiple same kind connectors. The same kind connector is the connector with same number and same distance of signal transmission pins.

Optionally, the number of the fixing pads is greater than or equal to a maximum number of fixing pins of the multiple same kind connectors.

Optionally, a location of the fixing pads is matched with all locations of the fixing pins of the multiple same kind connectors.

Optionally, a size of the fixing pads is greater than a maximum size of the fixing pins of the multiple same kind connectors in a same location.

Optionally, the size of the fixing pads is equal to a maximum size of the fixing pins of the multiple same kind connectors in the same location.

Optionally, the fixing pads are disposed around the signal transmission pin pad.

Optionally, the fixing pads comprise a plurality of first fixing pads. The first fixing pads are parallel disposed with the signal transmission pin pad.

Optionally, a cable in the center position of the first fixing pads is parallel with the signal transmission pin pad. Distance between two adjacent first fixing pads is equal.

Optionally, sizes of the first fixing pads are equal and shapes of the first fixing pins are same.

Optionally, the fixing pads comprise a plurality of second fixing pads. The second fixing pads are disposed on two sides of the signal transmission pin pad.

Optionally, a size of second fixing pads is greater than the size of the first fixing pads in same connectors.

Optionally, the size of second fixing pads is equal to the size of the first fixing pads in same connectors.

This application further discloses the circuit board, comprising the signal transmission pin pad configured to connect with signal transmission pins of an external same kind connectors to transmit the signal, and the fixing pads configured to fix fixing pins of the connectors. The number, location and size of the fixing pads is matched with the same kind connectors. The same kind connector is a connector with a same number and same distance of signal transmission pins.

The number of fixing pads is greater than or equal to the maximum number of fixing pins of multiple same kind connectors. The location of the fixing pads is matched with all location of the fixing pins of the same kind connectors. The size of the fixing pads is greater than or equal to the maximum size of the fixing pins of the same kind connectors in the same location.

This application further discloses a manufacturing method of a circuit board, the circuit board comprising the signal transmission pin pad configured to connect with signal transmission pins of an external same kind connectors to transmit the signal, and the fixing pads configured to fix fixing pins of the connectors. The number, location and size of the fixing pads is matched with a same kind connector. The same kind connector is a connector with a same number and same distance of signal transmission pins.

A manufacturing method of the circuit board, comprising the following steps:

counting number, position, and size of a same kind connector;

performing matching process of the same kind connector and fixing pads according to the counted result; and manufacturing a corresponding circuit board.

Optionally, a step of performing matching process of the same kind connector and fixing pads comprising:

determining the number of the fixing pads according to a maximum number of the fixing pins of the multiple same kind connectors;

determining a position of the fixing pins according to a position of the fixing pins of the multiple same kind connectors; and determining a size of the fixing pins according to a maximum size of the fixing pins of the multiple same kind connectors.

Optionally, the number of the fixing pads is greater than or equal to the maximum number of the fixing pins of the multiple same kind connectors.

Optionally, the location of the fixing pads is matched with all location of the fixing pins of the multiple same kind connectors.

Compared with solutions of different circuit boards with different same kind connectors design, in this application, the multiple same kind connectors using the same circuit board is realized by integrating matched the connecting pins of the same kind connector to redesign the fixing pads. So that, one circuit board to many connectors is realized which improve the matching of product and increase market competitiveness.

BRIEF DESCRIPTION OF DRAWINGS

The accompanying drawings included are used for helping understand the embodiments of this application, constitute a part of this specification, illustrate examples of the embodiments of this application and, together with the description, serve to explain the principles of this application. Obviously, the accompanying drawings in the following descriptions are merely some embodiments of this application. A person of ordinary skill in the art may further obtain other accompanying drawings according to these accompanying drawings without creative efforts. In the accompanying drawings.

DETAILED DESCRIPTION OF EMBODIMENTS

Figure 1:
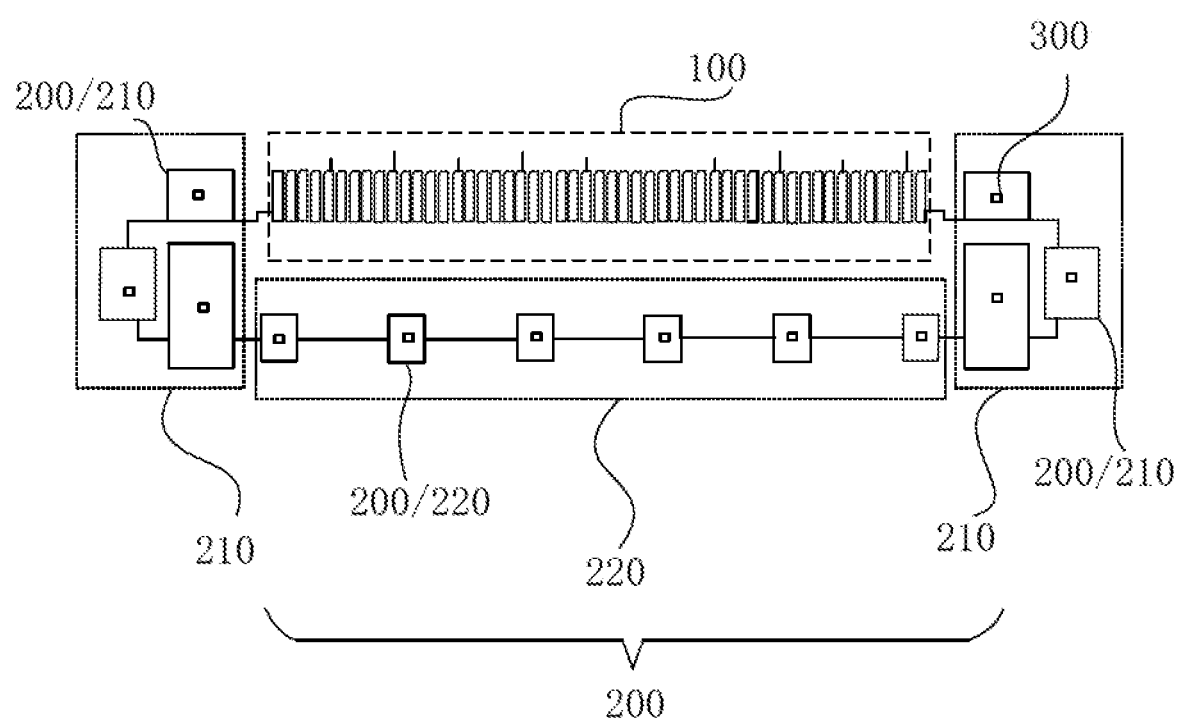
FIG. 1 is a schematic diagram of a circuit board according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection, or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

As shown in FIG. 4 to FIG. 7, an embodiment of this application discloses a signal transmission pin pad 100 of four kinds circuit board. A number and distance of signal transmission pins of corresponding same kind connectors are same. However, the number, location and size of the signal transmission pins of the same kind connectors exist differences. Correspondingly, a number, location and size of fixing pads 200 exists differences. When actual production, we need to design corresponding connectors circuit boards for each type of the connector, which increases design costs. Therefore, the circuit boards produced are less applicability.

Figure 8:
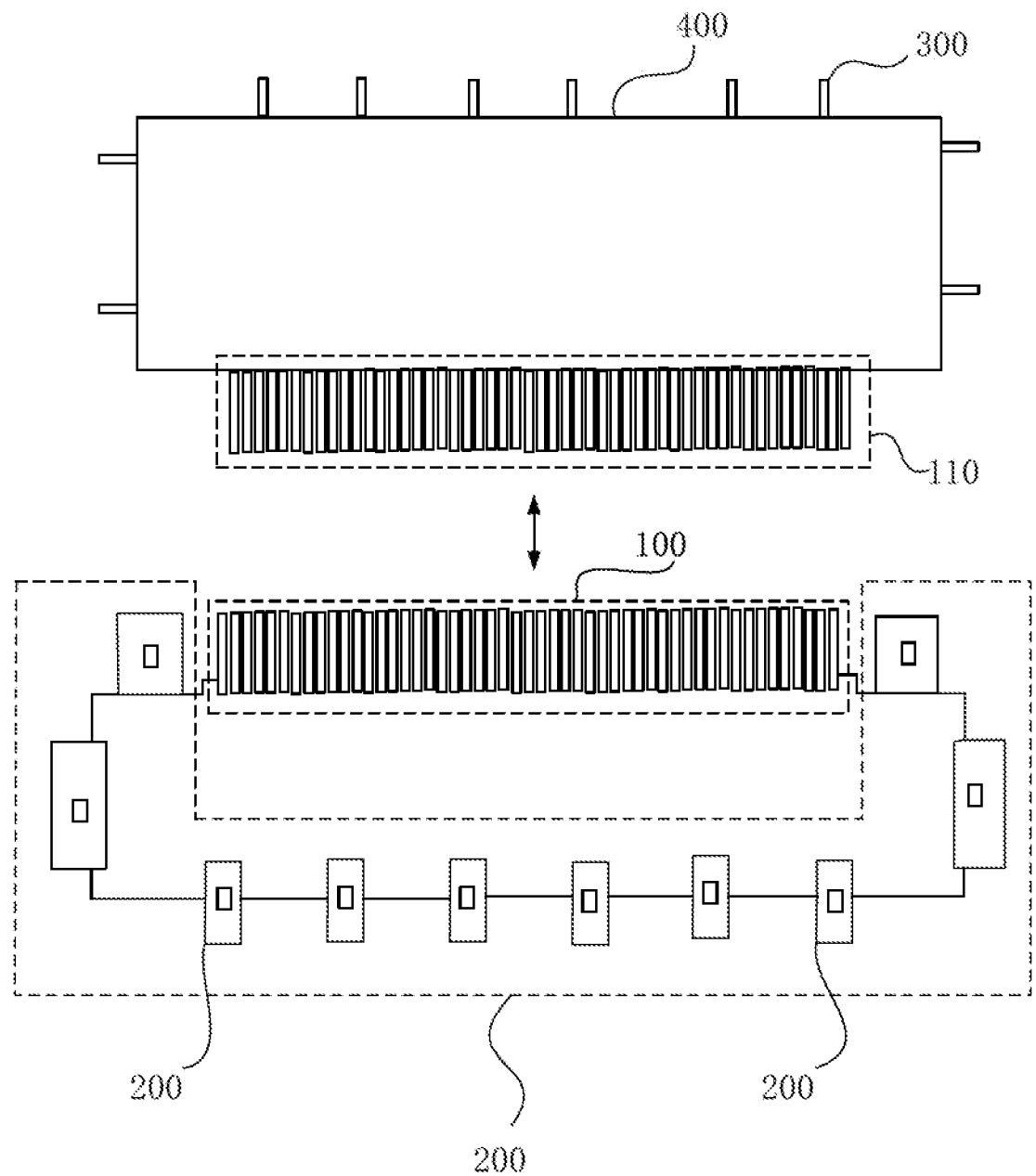
FIG. 8 is a relationship schematic diagram of a circuit board and a connector according to embodiment of this application.

As shown in FIG. 8, FIG. 8 is a relationship schematic diagram of a circuit board and a connector. The fixing pads and the signal transmission pin pad are disposed on the circuit board. The fixing pads and the signal transmission pin pad are respectively corresponded to the fixing pins and the signal transmission pins 110 of the connectors 400.

This application is described below with reference to the accompanying drawings and examples of embodiments.

As shown in FIG. 1, this application discloses a circuit board, including signal transmission pin pad 100 configured to connect with signal transmission pins of an external same kind connectors to transmit a signal, and fixing pads 200 configured to fix fixing pins 300 of connectors. A number, location, and size of the fixing pads 200 are matched with a same kind connector. A same kind connector is a connector with a same number and same distance of signal transmission pins. connectors At least one of the number, location or size of the fixing pins of the multiple same kind connectors is differences.

In this application, since research and development capabilities and process capabilities of each connector manufacturer are different, a shape and structure of the connector from each factory has difference. We divide the signal transmission pins with the same number and same distance into the same kind connectors. The number, location and size of fixing pins of the multiple same kind connectors match with the number, location and size of the fixing pads 200. And a packing graph of multiple connectors using the same circuit board is realized by integrating fixing pads 200. So that, one circuit board to many connectors is realized to matched same kind connector which increase market competitiveness.

In one or more embodiments, the number of the fixing pads 200 is greater than or equal to a maximum number of fixing pins 300 of the same kind connector.

In this application, each of the fixing pins 300 has the corresponding fixing pads 200. Numbers of the fixing pins 300 of the same kind connector are different. We count the number of the fixing pins 300 of the multiple same kind connectors. The number of the fixing pads 200 match with the number of the fixing pins 300 of the multiple same kind connectors. The number of fixing pads 200 to be designed is greater than or equal to the maximum number of fixing pins 300 of the same kind connectors. This design covers almost the same kind connectors. The fixing pins 300 of the different connectors in the circuit board have corresponding fixing pads 200.

In one or more embodiments, locations of the fixing pads 200 are matched with all locations of the fixing pins 300 of the multiple same kind connectors.

In this application, the locations of the fixing pins 300 of the same kind connector are not fixed. The locations of the fixing pads 200 is redesigned to match the location of the fixing pins 300 of the multiple same kind connectors. The difference situations exist in the location of the fixing pins 300 of the multiple same kind connectors are adapted. The all location of fixing pins is integrated to match through increase the fixing pads 200. Locations of the fixing pads 200 are covered a location of all the fixing pins 300 of the multiple same kind connectors is achieved.

In one or more embodiments, a size of the fixing pads 200 is greater than or equal to a maximum size of the fixing pins 300 of the multiple same kind connectors in the same location.

In this application, the number and size of the fixing pins 300 of the same kind connectors may exist differences in the same location. Some multiple connectors may have no the fixing pins 300 in the same location. Some multiple connectors may have one or multi fixing pins 300 in this location and the size of the fixing pins 300 exist differences. At the same time, the size of the fixing pads 200 is greater than or equal to a maximum size of the fixing pins 300 of the same kind connector in the same location by increase or decrease the size of the fixing pads 200.

In one or more embodiments, the fixing pads 200 are disposed around the signal transmission pin pad 100.

In this application, the fixing pads 200 and the signal transmission pin pad 100 are distributed around the circuit board. The signal transmission pin pad 100 is disposed between the fixing pads. The fixing pads 200 is linearly distributed along a direction of a wire. Only one of the fixing pads 200 exist in the position of the direction of the wire.

In one embodiment, the fixing pads 200 include a plurality of first fixing pads 220. The first fixing pads 220 are parallel disposed with the signal transmission pin pad 100. A cable in the center position of the first fixing pads 220 is parallel with the signal transmission pin pad 100. A distance between two adjacent first fixing pads 220 is equal. A shape of two adjacent first fixing pads 220 is same.

In this application, the first fixing pads 220 corresponding to the signal transmission pin pad 100 are evenly distributed on the circuit board. A distance between the first fixing pads 220 is equal. Therefore, an interaction force between the circuit board and the connectors are evenly distributed, which protect the circuit board and increase a service life of the circuit board.

In one or more embodiments, the fixing pads 200 include a plurality of second fixing pads 210. The second fixing pads 210 are disposed on the two sides of the signal transmission pin pad 100. A size and shape of second fixing pads 210 are greater than or equal to the size of the first fixing pads 210.

In this application, the signal transmission pin pad 100 is disposed on the middle portion of the circuit board. A space on the two sides of the circuit board are more than the middle portion of the circuit board. The size of the second fixing pads 210 is greater than or equal to the size of the first fixing pads 220. Therefore, the space is fully utilized and handle connection type is increased.

As another embodiment of this application, as shown in FIG. 1, this application further disclosures the circuit board, including the signal transmission pins pads 100 configured to connect with signal transmission pins of an external same kind connectors to transmit the signal, and fixing pads 200 configured to fix a fixing pin 300 of the connectors. The number, location and size of the fixing pads 200 are matched with the same kind connectors. The same kind connector is a connector with a same number of signal transmission pins and a same distance. The number of a fixing pads 200 is greater than or equal to the maximum number of a fixing pins of a same kind connector. The locations of the fixing pads 200 are matched with all locations of the fixing pins 300 of the multiple same kind connectors. The size of the fixing pads 200 is greater than or equal to the maximum size of the fixing pins 300 of the multiple same kind connectors in the same location.

In this application, since research and development capabilities and process capabilities of each connector manufacturer are different, a shape and structure of the connector from each factory has difference. We divide the signal transmission pins with the same number and same distance into the same kind connectors and match a number, location and size of the same kind connector fixing pads 200. And a packing graph of multiple connectors using the same circuit board is realized by integrating matched fixing pads 200. So that, one circuit board to many connectors is realized to match same kind connector which increase market competitiveness. Each of the fixing pins 300 has the corresponding fixing pads 200. Numbers of the fixing pins 300 of the same kind connector are different. We count the number of the fixing pins 300 of the same kind connector and match the number of the fixing pins 300 of the same kind connector. The number of fixing pads 200 to be designed is greater than or equal to the maximum number of fixing pins 300 of the multiple same kind connectors. This design covers almost the same kind of connectors. The fixing pins 300 of the different same kind connectors in the circuit board have corresponding fixing pads 200. The location of the fixing pins 300 of the multiple same kind connectors are not fixed. The locations of the fixing pads 200 is redesigned to match the location of the fixing pins 300 of the multiple same kind connectors. The difference situations exist in the location of the fixing pins 300 of the multiple same kind connectors are adapted. The all location of fixing pins 300 is integrated to match through increase the fixing pads 200. Locations of the fixing pads 200 are covered a location of all the fixing pins 300 of the multiple same kind connectors is achieved. Numbers of fixing pins 300 of different same kind connectors have difference in the same location. Some same kind connectors may do not have the fixing pins 300 in this location. Some same kind connectors may have one or multi fixing pins 300 in this location. At the same time, the size of the fixing pads 200 is greater than or equal to a maximum size of the fixing pins 300 of the same kind connector in the same location by increase or decrease the size of the fixing pads 200.

Figure 2:
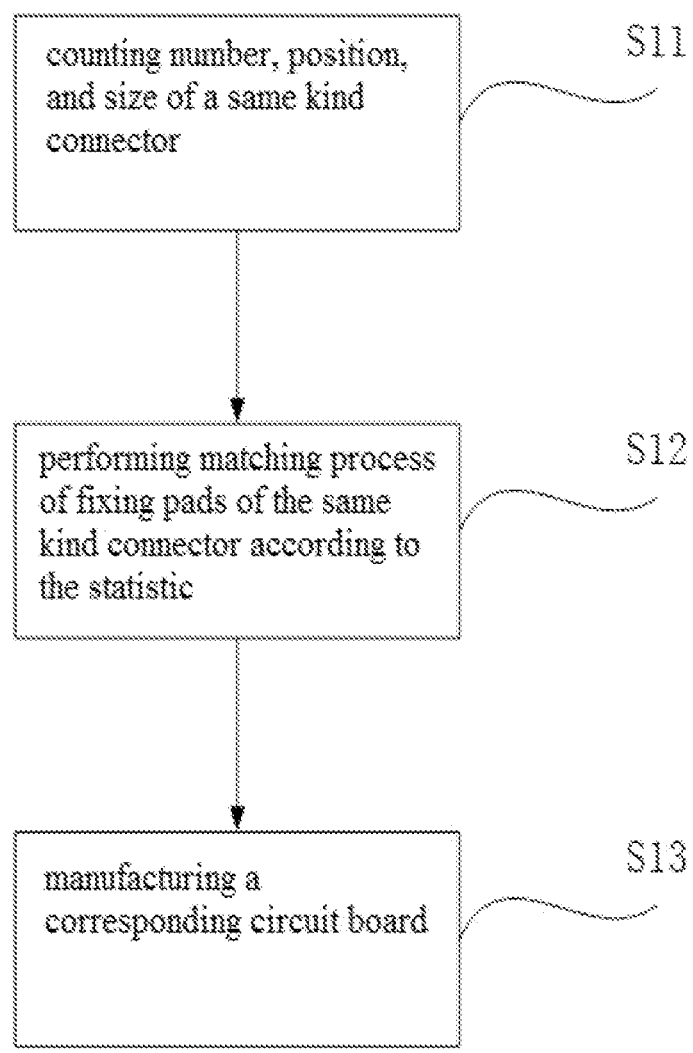
FIG. 2 is a flowchart of a manufacturing method of circuit board according to another embodiment of this application.
Figure 3:
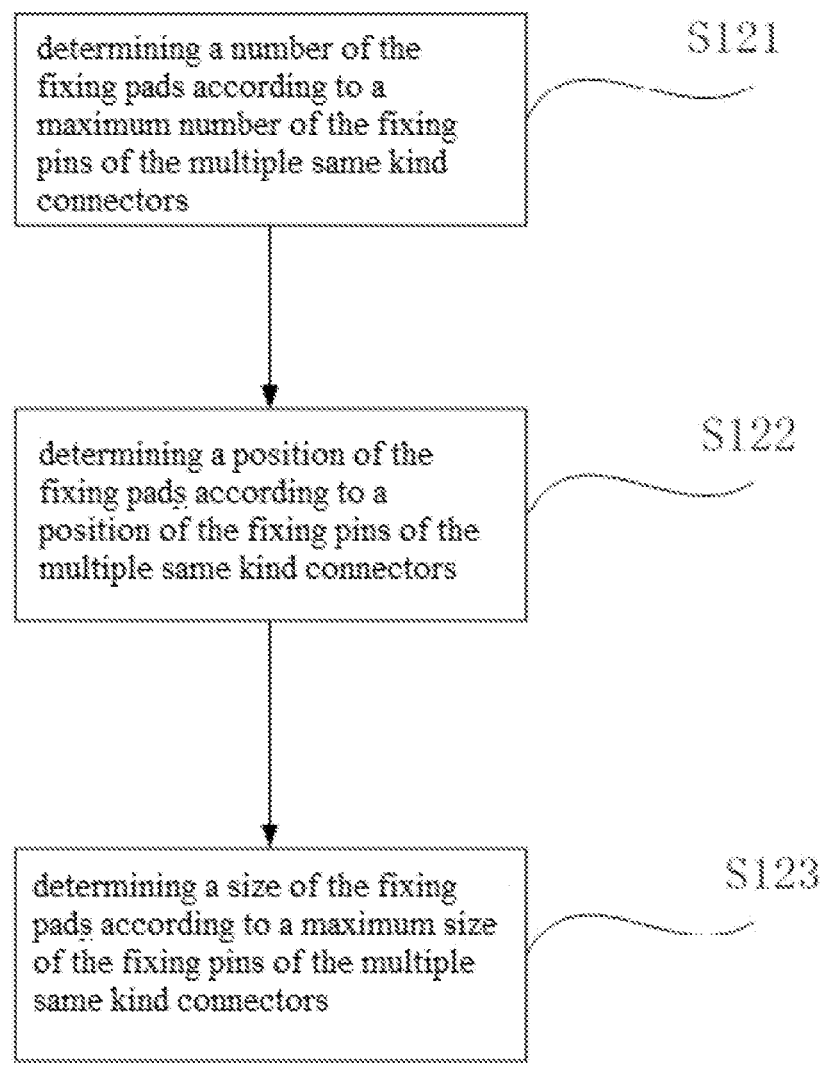
FIG. 3 is a flowchart of a manufacturing method of circuit board according to another embodiment of this application.
Figure 4:
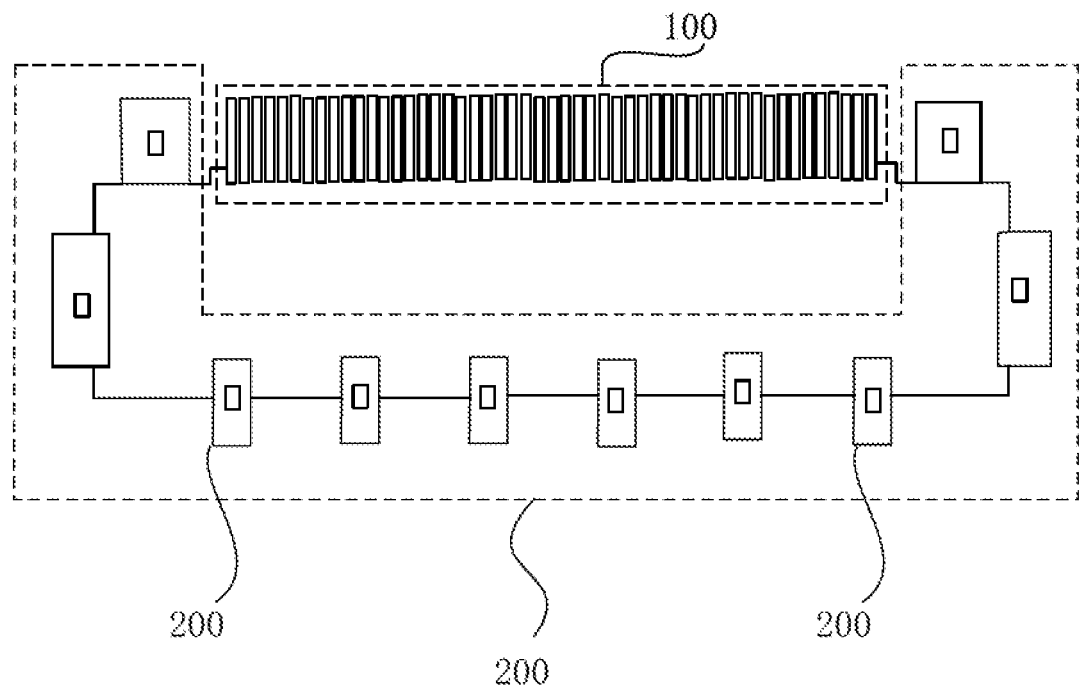
FIG. 4 is a schematic diagram of a circuit board with same signal transmission pins according to an embodiment of this application.
Figure 5:
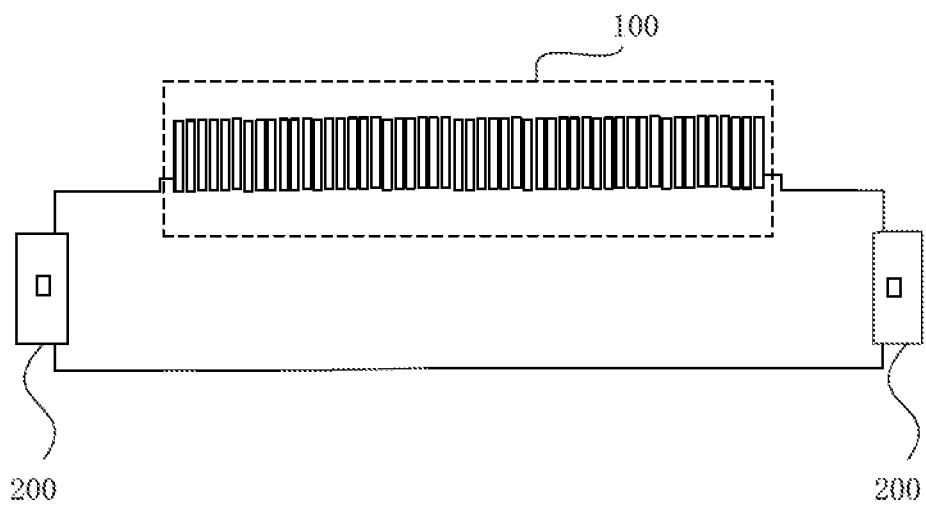
FIG. 5 is a schematic diagram of a circuit board with same signal transmission pins according to another embodiment of this application.
Figure 6:
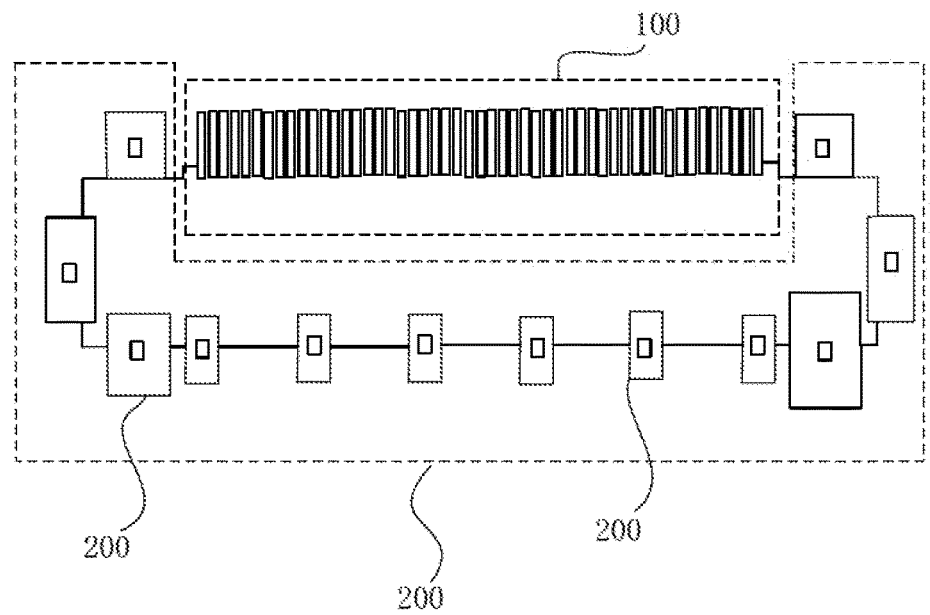
FIG. 6 is a schematic diagram of a circuit board with same signal transmission pins according to another embodiment of this application.
Figure 7:
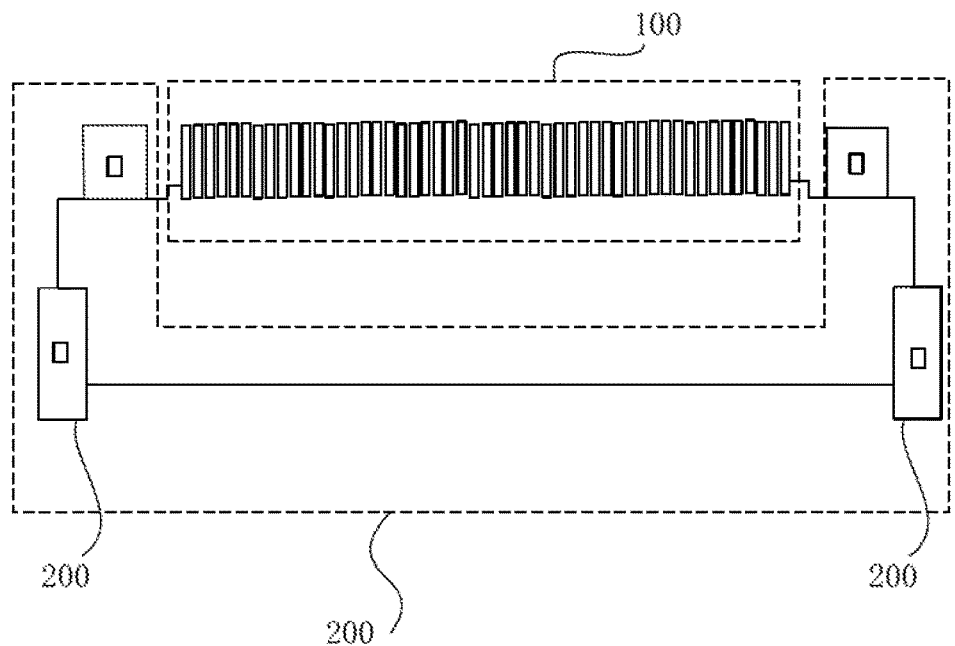
FIG. 7 is a schematic diagram of a circuit board with same signal transmission pins according to another embodiment of this application.

As another embodiment of this application, as shown in FIGS. 2-3, the application discloses a manufacturing method of a circuit board. The circuit board includes the signal transmission pin pad 100 configured to connect with signal transmission pins of an external same kind connectors to transmit the signal, and the fixing pads 200 configured to fix the fixing pins 300 of connectors. The number, location and size of the fixing pads 200 are matched with a same kind connector. The same kind connector is a connector with a same number of signal transmission pins 300 and a same distance of pins.

A manufacturing method of the circuit board, includes following steps:

S11: counting number, position, and size of a same kind connector;

S12: performing matching process of the same kind connector and fixing pads according to the counted result; and S13: manufacturing a corresponding circuit board.

In this application, the circuit board of the corresponding multiple same kind connector is redesigned. First, counting the number, location and size of the fixing pins of the multiple same kind connectors, which can check the different designs of the fixing pads for the same kind connectors. The statistics can be used for matching process of the fixing pads. Therefore, the fixing pads after integrate processing can dock to same kind connectors with different designs. The corresponding circuit board is made according to the package drawing after processing. The manufactured circuit board can be a same kind connector. One circuit board to many connectors is realized which improve the matching of product In one or more embodiments, a step of performing matching process of the same kind connector and a fixing pad comprising:

S121: determining the number of the fixing pads according to a maximum number of the fixing pins of the multiple same kind connectors;

S122: determining a position of the fixing pins according to a position of the fixing pins of the multiple same kind connectors; and S123: determining a size of the fixing pins according to a maximum size of the fixing pins of the multiple same kind connectors.

In this application, S121, S122 and S123 has no sequence. Three methods are used together to achieve the optional design in practice. Numbers of the fixing pins of the same type kind connector have difference. The fixing pads are integrated and matched according to the number, size and location of the fixing pins. The fixing pins in the same location base the size of the fixing pins in the same location to design the biggest size of the fixing pads, that is, increase the size of the fixing pads. The fixing pins in the different location can increase the number of fixing pads to match. To integrate and match the fixing pads, which can decrease the change in design to meet the requirements of customers and improve market competitiveness.

In one or more embodiments, the number of the fixing pads 200 is greater than or equal to the maximum number of the fixing pins 300 of the multiple same kind connectors.

In this application, each of the fixing pins 300 has the corresponding fixing pads 200. Numbers of the fixing pins 300 of the same kind connector are different. We count the number of the fixing pins 300 of the same kind connector and match the number of the fixing pins 300 of the same kind connector. The number of fixing pads 200 to be designed is greater than or equal to the maximum number of fixing pins 300 of the same kind connector. This design covers almost the same kind connectors. The fixing pins 300 of the different connectors in the circuit board have corresponding fixing pads 200.

In one or more embodiments, the locations of the fixing pads 200 are matched with all location of the fixing pins 300 of the multiple same kind connectors.

In this application, the locations of the fixing pins 300 of the same kind connector are not fixed and design the location of the fixing pad 200. The difference situations exist in the location of the fixing pins 300 of the multiple same kind connectors are adapted. The all location of fixing pins 300 is integrated to match through increase the fixing pads 200. Locations of the fixing pads 200 are covered a location of all the fixing pins 300 of the multiple same kind connectors is achieved.

It should be noted that the limitation of each step involved in the present disclosure is not determined to limit the sequence of steps without affecting the implementation of the specific solution. Steps written in the foregoing can be executed first, or later, or even simultaneously as long as the specific solutions can be implemented, which should be considered as the scope of the present disclosure.

The present disclosure is able to be applied on various display panels, such as a Twisted-Nematic (TN) type display panel, In-Plane Switching (IPS) type display panel, a Vertical-Alignment (VA) type display panel, and Multi-domain Vertical Alignment (MVA) type display panel. Of course, the display panel can be other types of display panels which is able to be applied, such as an Organic Light-Emitting Diode (OLED) display panel.

The above content is a further detailed description of the present disclosure in conjunction with the specific optional embodiments, and the specific implementation of the present disclosure is not limited to the description. It will be apparent to those skilled in the art that a number of simple deductions or substitutions may be made without departing from the conception of the present disclosure, which should be considered as being within the scope of the present disclosure.

What is claimed is:

1. A circuit board, comprising:
signal transmission pins pad configured to connect with signal transmission pins of an external same kind connectors to transmit a signal; and
fixing pads configured to fix fixing pins of connectors;
wherein number, location, and size of the fixing pads is matched with multiple same kind connectors; and
the same kind connector is a connector with a same number and same distance of signal transmission pins;
wherein the size of the fixing pads is greater than a maximum size of the fixing pins of the multiple same kind connectors in the same location.

2. The circuit board according to claim 1, wherein the number of the fixing pads is equal to a maximum number of fixing pins of the multiple same kind connectors.

3. The circuit board according to claim 1, wherein the number of the fixing pads is greater than a maximum number of fixing pins of the multiple same kind connectors.

4. The circuit board according to claim 1, wherein locations of the fixing pads are matched with all locations of the fixing pins of the multiple same kind connectors.

5. The circuit board according to claim 1, wherein the fixing pads are disposed around the signal transmission pin pad.

6. The circuit board according to claim 1, wherein the fixing pads comprise a plurality of first fixing pads; and the first fixing pads are parallel disposed with the signal transmission pin pad.

7. The circuit board according to claim 6, wherein a cable in the center position of the first fixing pads is parallel with the signal transmission pin pad; and distance between two adjacent first fixing pads is equal.

8. The circuit board according to claim 6, wherein sizes of the first fixing pads are equal and shapes of the first fixing pins are same.

9. The circuit board according to claim 6, wherein the fixing pads comprise a plurality of second fixing pads; and the second fixing pads are disposed on the two sides of the signal transmission pin pad.

10. The circuit board according to claim 9, wherein sizes of second fixing pads are greater than the sizes of the first fixing pads in same connector.

11. The circuit board according to claim 9, wherein the sizes of second fixing pads are equal to the sizes of the first fixing pads in same connector.

12. A manufacturing method of a circuit board, wherein the circuit board comprising a signal transmission pin pad configured to connect with signal transmission pins of an external same kind connectors to transmit the signal;
   fixing pads configured to fix a fixing pin of a connector;
   wherein a number, location and size of the fixing pads is matched with multiple same kind connectors; and
   the same kind connector is a connector with a same number and same distance of signal transmission pins;
   wherein the size of the fixing pads is greater than a maximum size of the fixing pins of the multiple same kind connectors in the same location;
   wherein the manufacturing method comprising:
   counting number, position, and size of a same kind connector;
   performing matching process of fixing pads of the same kind connector according to the statistic; and
   manufacturing a corresponding circuit board.

13. The manufacturing method of circuit board according to claim 12, wherein the step of performing matching process of the same kind connector and fixing pads comprising:
   determining the number of the fixing pads according to a maximum number of the fixing pins of the multiple same kind connectors;
   determining a position of the fixing pads according to a position of the fixing pins of the multiple same kind connectors; and
   determining a size of the fixing pads according to a maximum size of the fixing pins of the multiple same kind connectors.

14. The manufacturing method of circuit board according to claim 12, wherein the number of the fixing pads is greater than or equal to maximum number of the fixing pins of the multiple same kind connectors.

15. The manufacturing method of circuit board according to claim 12, wherein locations of the fixing pads are matched with all locations of the fixing pins of the multiple same kind connectors.

16. A circuit board, comprising:
   signal transmission pins pad configured to connect with signal transmission pins of an external same kind connectors to transmit a signal; and
   fixing pads configured to fix fixing pins of connectors;
   wherein number, location, and size of the fixing pads is matched with multiple same kind connectors; and
   the same kind connector is a connector with a same number and same distance of signal transmission pins;
   wherein the fixing pads comprise a plurality of first fixing pads; and the first fixing pads are parallel disposed with the signal transmission pin pad;
   wherein a cable in the center position of the first fixing pads is parallel with the signal transmission pin pad; and distance between two adjacent first fixing pads is equal.

* * * * *